United States Patent [19]

Wilson

[11] Patent Number: 4,945,319
[45] Date of Patent: Jul. 31, 1990

[54] HIGH FREQUENCY IMPEDANCE TRANSFORMER

[75] Inventor: Lance G. Wilson, North Hollywood, Calif.

[73] Assignee: Motorola, Inc., Schaumburg, Ill.

[21] Appl. No.: 387,317

[22] Filed: Jul. 28, 1989

[51] Int. Cl.$^5$ .............................................. H03H 7/38
[52] U.S. Cl. ...................................... 333/33; 333/245; 336/192; 336/195
[58] Field of Search ..................... 333/32, 33, 245, 246; 336/192, 195, 221; 361/400, 401, 409

[56] References Cited

U.S. PATENT DOCUMENTS

| Re. 31,704 | 10/1984 | Hester | 361/400 X |
| 3,051,918 | 8/1962 | Germeshausen | 333/33 X |
| 3,325,587 | 6/1967 | Sontheimer | 174/72 R |
| 3,469,194 | 9/1969 | Osborn | |
| 3,508,171 | 4/1970 | Podell | 333/11 |
| 3,559,091 | 1/1971 | Lunden et al. | 330/165 |
| 4,352,072 | 9/1982 | Harrington | 330/149 |
| 4,554,614 | 11/1985 | van der Wijst | 361/400 |
| 4,771,294 | 9/1988 | Wasilousky | 333/245 X |

FOREIGN PATENT DOCUMENTS 1807427  5/1970  Fed. Rep. of Germany ........ 333/32

OTHER PUBLICATIONS

Barabas, "On An Ultrabroad-Band Hybrid Tee", IEEE Transactions on Microwave Theory & Techniques, vol. MTT-27, No. 1, Jan. 1979, pp. 58-64.

Primary Examiner—Paul Gensler
Attorney, Agent, or Firm—Robert M. Handy

[57] ABSTRACT

An improved physical implementation of a high frequency impedance transformer circuit formed from three coaxial transmission line segments is described. In a preferred embodiment, each transmission line segment is in the form of a one and a half turn coil wrapped around a ferrite core. The ends of the coaxial transmission line segments extend through holes in a small PC board and planar conductors thereon. The ends of the transmission line shields are circumferentially soldered to some planar conductors on the board and the center conductors of the coaxial line segments are soldered to adjacent planar conductors on the board in such a way as to provide the desired circuit in a very compact and rugged arrangement.

18 Claims, 2 Drawing Sheets

HIGH FREQUENCY IMPEDANCE TRANSFORMER

FIELD OF THE INVENTION

This invention concerns electrical devices and, more particularly, means and methods for forming broadband, high frequency, impedance transformers.

BACKGROUND OF THE INVENTION

Impedance transformers are much used in electrical apparatus, especially electronic apparatus intended to operate in the radio and high frequency range (i.e., 10 to 10,000 MHz or higher). While conventional wire wound step-up or step-down transformers are useful at the lower end of this frequency range, they become ineffective as frequency increases At the upper end of the range, waveguides elements are used to provide impedance transformation. At intermediate frequencies it is known to use transmission line segments for providing impedance transformation.

A variety of transmission line and waveguide elements useful for impedance transformation are described by U. Barabas in "On an Ultrabroad-Band Hybrid Tee", IEEE Transactions on Microwave Theory and Techniques, Vol. MTT-27, No. 1, January 1979, pages 58–64 (hereafter Barabas). In particular, Barabas describes a broad-band line transformer having a transmission ratio $Z_{in}:Z_{out}$ of approximately 2:1 formed from three segments of coaxial transmission line. Ferrite beads are provided on the outside of the coaxial transmission lines to increase their inductance.

The input and output impedance of Barabas's transformer are given by $Z_{in} = Z_o = (3/2) Z_{otr}$ and $Z_{out} = Z_o/2 = (2/3) Z_{otr}$ where $Z_o$ is the characteristic impedance of the input and output lines and $Z_{otr}$ is the characteristic impedance of the coaxial transmission line segments. It is not possible to simultaneously match the impedance of input and output. However, for many applications, impedance transformation is more important than impedance matching. Hence, the coaxial transmission line transformer described by Barabas is useful. The coaxial line impedance transformer circuit described by Barabas is shown schematically in FIG. 1.

While Baraba's coaxial transmission line impedance transformer can give good results and can operate over a relatively broad frequency range (2.4–5000 MHz according to Barabas), the mechanical implementation taught by Barabas (see FIG. 2) is awkward and difficult to combine with other electronic functions. Further, it utilizes expensive materials and requires precision assembly. Accordingly, a need continues to exist for more convenient and compact implementations of the impedance transformer described by Barabas, particularly, implementations that are simple, inexpensive and well suited to production applications.

SUMMARY OF THE INVENTION

It is the object of the present invention to provide an improved implementation of a coaxial impedance transformer according to the circuit described by Barabas. It is a further object to provide an improved implementation which is simple to construct, extremely rugged, low in cost, very compact, easily combined with other electronic functions and which gives good performance.

These and other objects and advantages are provided by a high frequency impedance transformer, comprising, three transmission line segments, each having a central conductor and coaxial shield, and a circuit board having substantially co-planar conductors thereon adapted to receive, at first locations, the coaxial shields of the transmission line segments and allow the central conductors to pass therethrough without electrical contact at the first locations and second locations for receiving the central conductors.

It is convenient to use equi-length coaxial line segments which have been formed into coils wrapped around ferrite cores, one per coil. The exact number of turns is not critical. One and one half turns is suitable. In a preferred embodiment, the three ferrite loaded coaxial coils are mounted adjacent one another along the same axis on one side of the circuit board with the interconnecting conductors on the other side of the board. The shields preferably extend through the board conductors substantially at right angles to the plane of the board conductors and are circumferentially soldered thereto. The central conductors extend beyond the shield ends to adjacent conductors on the board. No cross-overs are required.

The planar board conductors desirably comprise a first conductor for receiving the shields of first ends of the first and second transmission line segments, a second conductor for receiving at a first location, the shield of the first end of the third transmission line segment and, at a second location the central conductors of the first and second transmission line segments, a third conductor for receiving the shields of second ends of the second and third transmission line segments, a fourth conductor for receiving the central conductors of second ends of the first and third transmission line segments, a fifth conductor for receiving at a first location the shield of a second end of the first transmission line segment and at another location the central conductor of a second end of the second transmission line segment, and a sixth conductor for receiving the central conductor of a first end of the third transmission line segment.

The first and sixth conductors conveniently provide one connection to the transformer and the third and fourth conductors provide another connection to the transformer. It is convenient to have the transformer connections extend laterally from opposite edges of the circuit board.

BRIEF DESCRIPTION OF THE FIGURES

FIGS. 1B–C illustrate, respectively, the prior art implementation by Barabas of the input and output portions of the circuit of FIG. 1;

FIGS. 2A–C show, respectively and in simplified form, a top view, bottom view and partial cut-away side view of the arrangement of a coil for use in a preferred implementation of the impedance transformer circuit of Barabas, according to the present invention;

DETAILED DESCRIPTION OF THE FIGURES

Figure 1A:
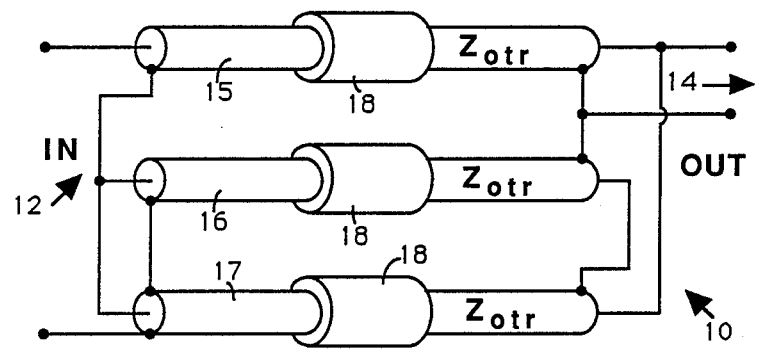
FIG. 1A is a simplified schematic diagram of the prior art coaxial impedance transformer circuit described by Barabas.

As those of skill in the art will appreciate, the designations "IN" and "OUT" with reference to the circuit of FIG. 1A and the implementations of FIGS. 1B–C, 3A–B and 4 are arbitrary, since either termination may be used to inject energy and the other used to extract energy and the device may function either as a step-up or step-down transformer.

FIGS. 1A and 1B–C show, respectively, the coaxial transmission line impedance transformer circuit and mechanical implementation taught by Barabas. Referring now to FIG. 1, circuit 10 comprises input 12 and output 14, and three coaxial transmission line segments 15–17, connected as shown. Ferrite beads 18 are provided on coaxial line segments 15–17 to increase their inductance.

Those of skill in the art will understand that each transmission line segment 15–17 comprises a central conductor, e.g., an insulated wire or wires, surrounded by a coaxial conductive shield, e.g., a conductive braid, foil, tubing or combination thereof. Except for the end connections, the central conductor and coaxial shield are insulated from each other. The transmission line segments have a characteristic impedance $Z_{otr}$ determined by the dimensions of the inner and outer conductors and properties of the intervening dielectric, according to well known principles.

In circuit 10 of FIG. 1A, one input lead is connected to the central conductor of the input end of transmission line segment 15 and the other input lead is connected to the shield conductors of the input end of both line segments 16 and 17. Also at the input end, the central conductors of transmission line segments 16, 17 are connected to the shield of line segment 15. One output lead is connected to the central conductor of the output end of transmission line segments 15 and 17, the other output lead is connected to the shield conductors at the output ends of line segments 15, 16, and the output end shield of line segment 17 is connected to the central conductor at the output end of line segment 16.

Barabas's mechanical implementation of the input and output end interconnections that make up the impedance transformer circuit of FIG. 1A are shown in FIGS. 1B–C, with FIG. 1B showing the input side connections and FIG. 1C showing the output side connections. The input and output signals are carried by coaxial transmission lines having a characteristic impedance of $Z_o$. Hybrid "T" 19A provides the input side connections between input line 12 and the input ends of the three transmissions line segments 15, 16, 17. Hybrid "T" 19B provides the same function between output line 14 and the output ends of line segments 15, 16, 17. The coaxial lines are connected to short (few millimeter) microstrip lines which are in turn combined in the "T" junction. The "T" junction was formed from crossed copper covered 1 mm thick dielectric (Teflon ™) plates. Coaxial lines were inserted into the "T" in holes drilled at an angle into the junction of the crossed plates.

While the results obtained by Barabas are encouraging, the implementation of the coaxial transmission line transformer of FIG. 1 is difficult to employ in practical situations, as for example, as a step-up or step-down impedance coupling transformer for a high frequency amplifier. Impedance transformers for use in such situations should be compact, inexpensive, rugged and easy to assembly, be tolerant of production variations, give good performance, and in some cases, able to handle substantial amounts of power. These desirable properties are provided by the invented implementation described below and in connection with FIGS. 2A–C, 3A–B and 4.

Figure 2A:
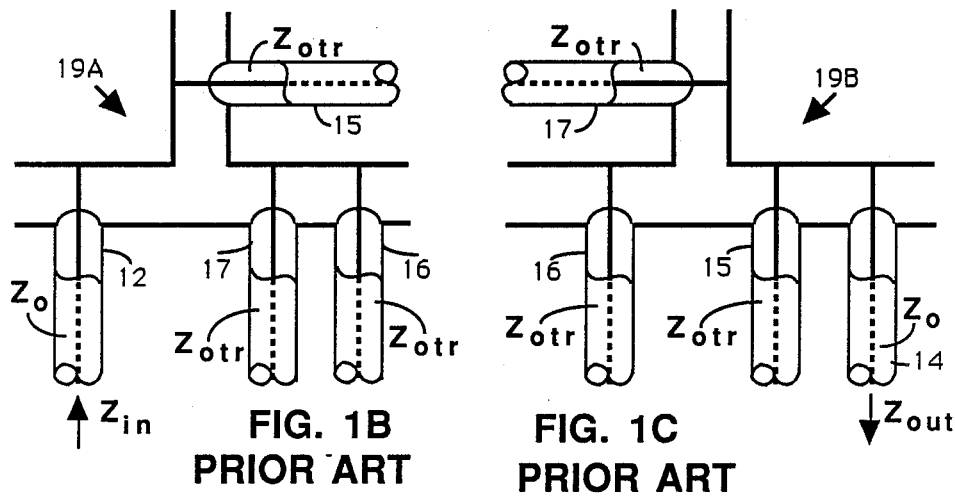
Figure 2A:
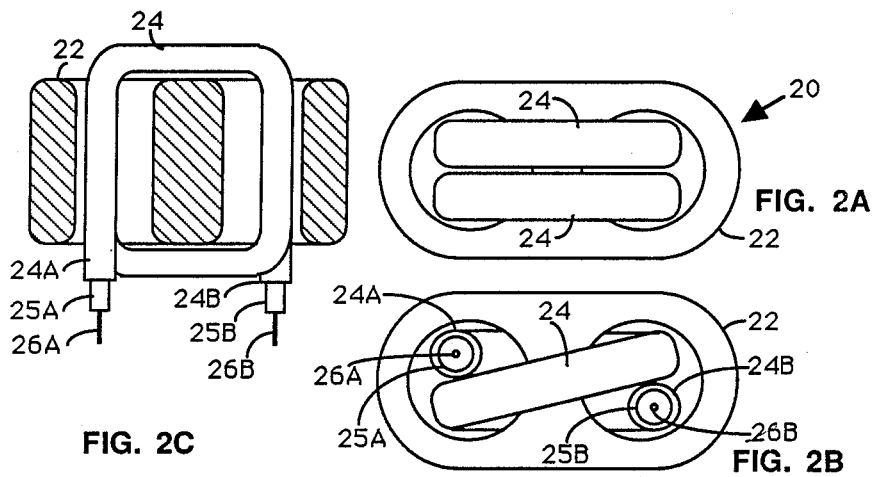

FIG. 2A is a top view, FIG. 2B a bottom view and FIG. 2C a partial cut-away side view of coiled coaxial transmission line segment 20 preferred for implementing the circuit of FIG. 1. Transmission line segment 20 forms a one and one-half turn coil around optional but desirable ferrite core 22. The length of the line segments, the number of turns and the core material affect the behavior of the transformer, particularly operating frequency range. For example, using a ferrite core and/or increasing the number of turns and line segment length, extends the low frequency response but may degrade the high frequency response. Omitting the ferrite core and/or decreasing the number of turns and shortening the line segment length tend to have the opposite effect. Those of skill in the art will understand based on the description herein how to select the appropriate line segment length, the number of turns and the core material (if used) to suit their intended application without undue experimentation.

Transmission line segment 20 comprises coaxial shield conductor 24 having ends 24A–B, and internal dielectric having ends 25A–B and a central conductor having ends 26A–B, where "A" and "B" identify opposite ends of the line segment. As will be subsequently explained in more detail, it is desirable that line segment 20 be formed such that shield ends 24A–B protrude a sufficient distance below ferrite 22 to allow penetration through a planar conductor and that dielectric ends 25A–B and central conductor ends 26A–B extend further so as to permit direct connection to other planar conductors.

Figure 3A:
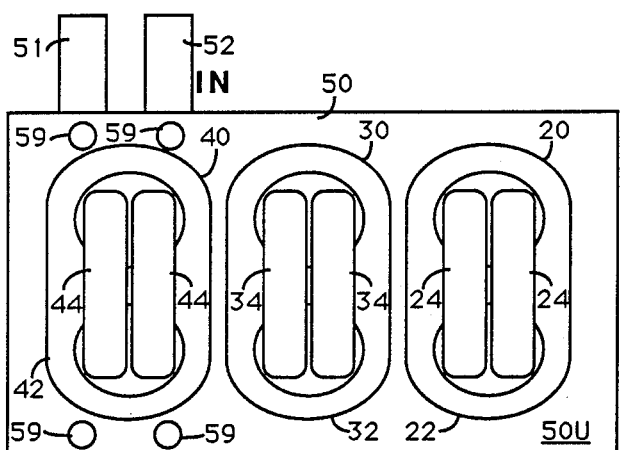
FIGS. 3A–B show, respectively and in simplified form, top and bottom views of a preferred implementation of the impedance transformer circuit of Barabas, according to the present invention employing three coaxial coils of the type illustrated in FIGS. 2A–C.
Figure 3B:
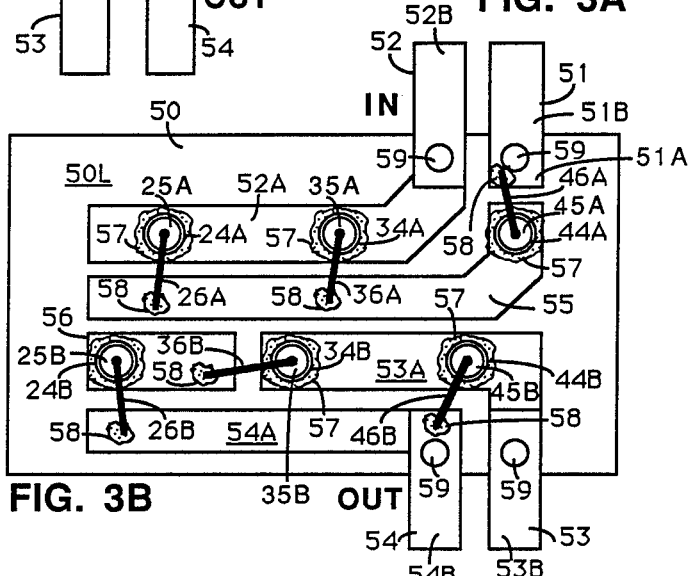
Figure 4:
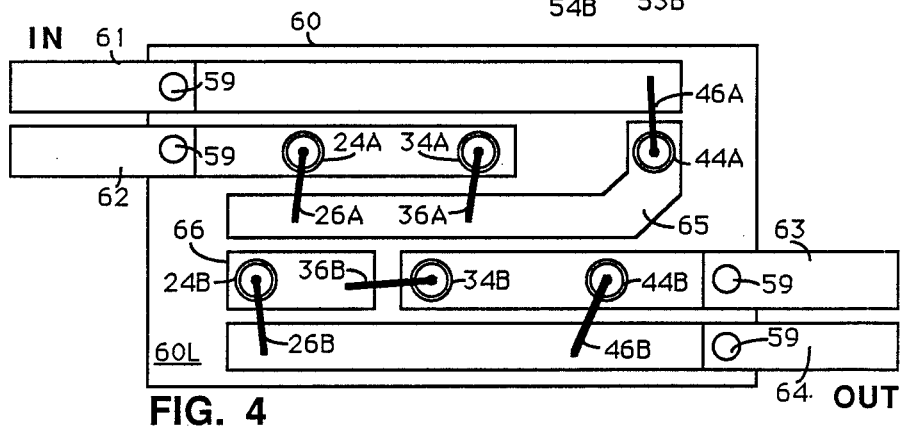
FIG. 4 shows a bottom view analogous to that shown in FIG. 3B but according to a further implementation of the present invention.

Referring now to FIGS. 3A–B and 4, three transmission line segments, designated by the numbers 20, 30 and 40 and wound on ferrite cores 22, 32, and 42 respectively are used to implement the circuit of FIG. 1. It is desirable that the transmission line segments be substantially identical in characteristic impedance, length and physical construction. Line segments 30 and 40 are substantially identical to line segment 20. For simplicity, the same convention has been used in identifying the shields (24, 34, 44), the shield ends (24A–B, 34A–B, 44A–B), dielectric ends (25A–B, 35A–B, 45A–B) and central conductor ends (26A–B, 36A–B, and 46A–B) for the three line segments (20, 30, 40).

Type UT34 (25 Ohm) semi-rigid coaxial transmission line manufactured by Uniform Tubes Co. of Collegeville, PA is suitable for forming line segments 20, 30, 40. This coaxial transmission line has an outer shield diameter of approximately 0.86 mm, and the three segments were of substantially equal length. A shield-end to shield-end length for each transmission line segment of about 52 to 55 mm is convenient, about 53 to 54 mm preferred and about 53 mm typical. Type 12-360-K ferrite cores manufactured by Ferrontics of Fairport, NY are suitable for cores 22, 32, 42. However, as those of skill in the art will appreciate other types of coaxial transmission line having longer or shorter lengths can also be used. Other Ferrite cores are also suitable or the ferrite can be omitted entirely. Those of skill in the art will understand based on known scientific principles and the teachings herein how to select the size and characteristic impedance of the transmission line segments and the size and properties of the cores to meet different electrical requirements for the transformer.

FIG. 3A shows a top view of a coaxial line impedance transformer implemented according to a preferred embodiment of the present invention. Transmission line segments 20, 30, 40 each comprising, preferably, one and a half turns of the abovedescribed coaxial transmission line on a ferrite core are mounted on upper surface 50U of circuit board 50. Input leads 51, 52 and output leads 53, 54 extend from opposite edges of board 50.

FIG. 3B shows lower side 50L of board 50 of FIG. 3A, incorporating substantially planar conductors 51–56 to which shields 24A–B, 34A–B and 44A–B and center conductors 26A–B, 36A–B and 46A–B are connected to implement the circuit of FIG. 1. There is no requirement that any of planar conductors 51–56 incorporate cross-overs.

Shield ends 24A–B, 34A–B and 44A–B desirably pass through board 50 and through planar conductors 52–53 and 55–56 and are conveniently electrically connected to conductors 52–53 and 55–56, for example, by solder 57 extending around the circumference or perimeter of each shield end 24A–B, 34A–B and 44A–B where they penetrate conductors 52–53 and 55–56. This construction provides very low resistance and low inductance connections to shields 24, 34 and 44, which is highly desirable for good performance.

While it is desirable that conductors 51–56 are on lower face 50L of board 50, that line segments 20, 30, 40 extend from upper face 50U of board 50, and that shield ends 24A–B, 34A–B and 44A–B pass through board 50, these features are not essential. For example, conductors 51–56 could also be located on upper surface 50U or partly on upper surface 50U and lower surface 50L. However, the invented arrangement is particularly simple and convenient since the line segments extend from the opposite face of the board on which the connections are made and do not interfere therewith. This facilitates assembly. Also, having the shield ends extend through board 50 lends additional strength to the whole assembly, further contributing to its ruggedness.

Center conductors 26A–B, 36A–B and 46A–B are electrically connected to planar conductors 51, 54–56 as shown in in FIG. 3B, conveniently by solder 58, but other connecting means may also be used. Conductors 51–56 are laid out so as to provide the interconnections dictated by the circuit of FIG. 1 without requiring any cross-overs and while allowing center conductors 26A–B, 36A–B and 46A–B to attach directly to conductors adjacent to the conductors to which their respective shield ends 24A–B, 34A–B and 44A–B are attached. This provides very short connection pathways for center conductors 26A–B, 36A–B and 46A–B, which further improves performance.

Referring now to FIG. 3B, shield ends 24A and 34A of line segments 20, 30 are connected to conductor 52, shield end 44A of line segment 40 is connected to conductor 55, shield end 24B of line segment 20 is connected to conductor 56, and shield ends 34B and 44B of line segments 30 and 40 are connected to conductor 53. Center conductors 26A and 36A of line segments 20, 30 are connected to conductor 55, center conductor 46A of line segment 40 is connected to conductor 51, center conductors 26B and 46B of line segments 20 and 40 are connected to conductor 54, and center conductor 36B of line segment 30 is connected to conductor 56.

A further optional but desirable feature of the present invention is that portions 51B–54B of conductors 51–54 that extend from the edges of board 50 are made flexible to reduce 10 mechanical stress on board 50. Portions 51A–54A of leads 51–54 that lie within the perimeter of board 50 are conventional planar film or foil leads provided on board 50 by means well known in the art. Portions 51B–54B that extend beyond the edges of board 50 are desirably braided copper that has been solder filled. This provides leads with good dimensional stability so as to have consistent high frequency properties, but also that yield during attachment so as to relieve any stress involved in mating the transformer to other parts of an electronic circuit. It is desirable to provide rivet or other attachment means 59 to firmly secure external lead portions 51B–54B to board 50.

A transformer corresponding substantially to the embodiment depicted in FIGS. 3A–B, was constructed using the above described coils for line segments 20, 30, 40 and board 50 of dimensions of about 0.8×15×26 mm formed of Type G-10 epoxy printed circuit board manufactured by the Mica Corporation of Culver City, CA with etched copper foil conductors about 0.034 mm thick and soldered connections. The transformer was used as an output combiner in the transistor output stage of a 100–500 MHz amplifier with excellent results. Exclusive of the flying input/output leads, the above-described transformer occupied a volume of about 12×15×26 mm and handled approximately 15 Watts of power. The observed bandwidth was 10–600 MHz and the insertion loss was less than 0.5 db at 500 MHz. The input and output virtual standing wave ratio was less than 1.5:1 over the 10–600 MHz frequency range.

FIG. 4 which is analogous to FIG. 3B, illustrates another embodiment of the invention in which line segments 20, 30, 40 are inserted through board 60 in the same way as through board 50, but conductors 61–66 are arranged so that external connections 61–64 extend from the end edges of board 60 in FIG. 4, as compared to leads 51–54 that extend from the side edges of board 50 in FIG. 3B. Otherwise, the embodiment of FIG. 4 is the same as FIG. 3B. For simplicity, details such as solder regions 57, 58 are not shown in FIG. 4, but those of skill in the art will understand that solder or equivalent electrical and mechanical attachment means are provided.

Having thus described the invention, it will be apparent to those of skill in the art that the present invention provides an improved implementation of a coaxial line transformer that is physically rugged, small in size, easy to assemble and use, inexpensive to construct and that gives good performance. While the present invention has been described in terms of certain materials and configurations, those of skill in the art will appreciate based on the teachings herein that other materials and configurations could also be used and other equivalent transformers constructed based thereon. Accordingly, it is intended to incorporate all such variations and equivalents in the claims that follow.

I claim:

1. A broadband high frequency impedance transformer, comprising:
   first, second and third portions of coaxial transmission line, each portion forming a coil having first and second ends with each end having a shield conductor and central conductor; and
   a circuit board having means for connecting circuit board conductors to the shield conductors and central conductors of ends of the transmission line portions, comprising,
a first circuit board conductor coupled to the shield conductors of first ends of the first and second transmission line portions,
a second circuit board conductor coupled to the shield conductor of the first end of the third transmission line portion and the center conductors of the first ends of the first and second transmission line portions,
a third circuit board conductor coupled to the shield conductors of the second ends of the second and third transmission line portions,
a fourth circuit board conductor coupled to the center conductors of the second ends of the first and third transmission line portions,
a fifth circuit board conductor coupled to the shield portion of the second end of the first transmission line portion and the center conductor of the second end of the second transmission line portion, and
a sixth circuit board conductor coupled to the center conductor of the first end of the third transmission line portion.

2. The transformer of claim 1 wherein each transmission line portion forms a one and a half turn coil.

3. The transformer of claim 2 wherein each coil encloses a ferromagnetic core.

4. The transformer of claim 3 wherein each coil encloses a separate ferromagnetic core.

5. The transformer of claim 1 wherein each transmission line portion forms a one and a half turn coil and wherein the three one and a half turn coils are mounted side-by-side on the circuit board along a common axis.

6. The transformer of claim 1 wherein the shield conductors of the transmission line portions extend to the circuit board conductors and the central conductors extend through holes therein.

7. The transformer of claim 1 wherein central conductors of the first and second ends of the three transmission line portions extend through holes in the first, second, third and fifth circuit board conductors and are connected directly to the second, fourth, fifth and sixth circuit board conductors.

8. The transformer of claim 7 wherein the central conductors of the first and second ends of the three transmission line portions are connected to the second, fourth, fifth and sixth circuit board conductors without crossing other circuit board conductors.

9. The transformer of claim 1 wherein the first and sixth circuit board conductors comprise one connection to the transformer and the third and fourth circuit board conductors comprise another connection to the transformer.

10. The transformer of claim 9 wherein the one connection and the another connection extend laterally from opposite edges of the circuit board.

11. A high frequency impedance transformer comprising:
multiple coiled transmission lines each having first and second ends including a shield and a central conductor;
a first planar conductor joining the shields of first ends of first and second coiled transmission lines and having openings therein wherein the central conductors thereof pass through;
a second planar conductor joining the central conductors of the first ends of the first and second coiled transmission lines and the shield of a first end of a third coiled transmission line;
a third planar conductor joining the shields of second ends of the second and third coiled transmission lines and having openings therein wherein the central conductors thereof pass through;
a fourth planar conductor joining the central conductors of the second ends of the first and third coiled transmission lines;
a fifth planar conductor joining the shield of a second end of the first coiled transmission line and the central conductor of the second end of the second coiled transmission line, wherein the fifth planar conductor has an opening therein for the central conductor of the second end of the first coiled transmission line to pass through; and
a sixth conductor connected to the central conductor of the first end of the third coiled transmission line.

12. The transformer of claim 11 wherein the first through sixth conductors are supported by a circuit board.

13. The transformer of claim 12 wherein the ends of the first through third coiled transmission lines extend into holes in the circuit board.

14. The transformer of claim 13 wherein the first through third coiled transmission lines have substantially equal length.

15. A high frequency impedance transformer, comprising:
three equi-length segments of coaxial transmission line, each having a central conductor and an electrically conductive coaxial shield at opposed ends thereof; and
a circuit board having substantially co-planar conductors thereon to which, at first locations, are attached the opposed ends of the coaxial shields and through which pass the central conductors without electrical contact at the first locations, and to which, at second locations, are attached the opposed ends of the central conductors.

16. A high frequency impedance transformer, comprising, three equi-length transmission line segments, each having a central conductor and coaxial shield, and a circuit board having substantially co-planar conductors thereon adapted to receive, at first locations, the coaxial shields of the transmission line segments and allow the central conductors to pass therethrough without electrical contact at the first locations and second locations for receiving the central conductors, wherein the planar conductors comprise a first conductor for receiving the shields of first ends of the first and second transmission line segments, a second conductor for receiving at a first location, the shield of the first end of the third transmission line segment and, at a second location the central conductors of the first and second transmission line segments, a third conductor for receiving the shields of second ends of the second and third transmission line segments, a fourth conductor for receiving the central conductors of second ends of the first and third transmission line segments, a fifth conductor for receiving at a first location the shield of a second end of the first transmission line segment and at another location the central conductor of a second end of the second transmission line segment, and a sixth conductor for receiving the central conductor of a first end of the third transmission line segment.

17. The transformer of claim 16 wherein the first and sixth conductors comprise one connection to the transformer and the third and fourth conductors comprise another connection to the transformer.

18. The transformer of claim 17 wherein the one connection and the another connection extend laterally from opposite edges of the circuit board.

* * * * *